(12) United States Patent
Ito et al.

(10) Patent No.: US 8,198,141 B2
(45) Date of Patent: Jun. 12, 2012

(54) INTERMEDIATE STRUCTURE OF SEMICONDUCTOR DEVICE AND METHOD OF MANUFACTURING THE SAME

(75) Inventors: Youkou Ito, Tokyo (JP); Takashi Ohba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 65 days.

(21) Appl. No.: 12/636,959

(22) Filed: Dec. 14, 2009

(65) Prior Publication Data

US 2010/0148377 A1 Jun. 17, 2010

(30) Foreign Application Priority Data

Dec. 15, 2008 (JP) .................................. 2008-318699

(51) Int. Cl.
*H01L 21/50* (2006.01)
*H01L 21/48* (2006.01)
*H01L 21/44* (2006.01)

(52) U.S. Cl. ......... 438/127; 438/126; 438/110; 438/125

(58) Field of Classification Search .................. 438/110, 438/125–127
See application file for complete search history.

(56) References Cited

U.S. PATENT DOCUMENTS

| | | | | |
|---|---|---|---|---|
| 5,108,955 A * | 4/1992 | Ishida et al. | ..................... | 29/827 |
| 5,612,513 A * | 3/1997 | Tuttle et al. | ..................... | 174/260 |
| 5,927,505 A * | 7/1999 | Chia et al. | ..................... | 206/710 |
| 6,072,122 A * | 6/2000 | Hosoya | ......................... | 174/524 |
| 6,469,382 B1 * | 10/2002 | Hotozuka et al. | ............. | 257/724 |
| 6,538,317 B1 | 3/2003 | Miyata | | |
| 6,546,620 B1 * | 4/2003 | Juskey et al. | ................... | 29/840 |
| 6,573,612 B1 | 6/2003 | Miyata | | |
| 6,656,773 B2 * | 12/2003 | Boyaud et al. | ................ | 438/127 |
| 6,709,170 B2 * | 3/2004 | Tartaglia et al. | ................ | 385/94 |
| 6,838,759 B1 * | 1/2005 | Liu | ................................ | 257/679 |
| 6,963,141 B2 * | 11/2005 | Lee et al. | ....................... | 257/796 |
| 7,001,083 B1 * | 2/2006 | Nguyen et al. | ................... | 385/94 |
| 7,015,593 B2 * | 3/2006 | Kazama | .......................... | 257/790 |
| 7,808,004 B2 * | 10/2010 | Sun et al. | ......................... | 257/79 |
| 2005/0106786 A1 * | 5/2005 | Kuratomi et al. | ............. | 438/127 |
| 2008/0268559 A1 * | 10/2008 | Jung | ................................ | 438/26 |
| 2009/0236726 A1 * | 9/2009 | Retuta et al. | ................... | 257/690 |

FOREIGN PATENT DOCUMENTS

| | | |
|---|---|---|
| JP | 10-326800 (A) | 12/1998 |
| JP | 2001-44229 (A) | 2/2001 |
| JP | 2001-44324 (A) | 2/2001 |
| JP | 2007-281374 (A) | 10/2007 |

* cited by examiner

*Primary Examiner* — Luan C Thai
(74) *Attorney, Agent, or Firm* — Foley & Lardner LLP

(57) ABSTRACT

An intermediate structure for semiconductor devices includes a wiring board, a plurality of semiconductor chips mounted on the wiring board, and a sealing body for collectively sealing the plurality of semiconductor chips and having a region with a different thickness.

16 Claims, 16 Drawing Sheets

INTERMEDIATE STRUCTURE OF SEMICONDUCTOR DEVICE AND METHOD OF MANUFACTURING THE SAME

This application is based upon and claims the benefit of priority from Japanese patent application No. 2008-318699, filed on Dec. 15, 2008, the disclosure of which is incorporated herein in its entirety by reference.

BACKGROUND OF THE INVENTION

1. Field of the Invention

The present invention relates to an intermediate structure of a semiconductor device and a method of manufacturing the same.

2. Description of the Related Art

BGA (Ball Grid Array) type semiconductor devices have been manufactured by using a MAP (Mold Array Process), in which a wiring board having a plurality of product formation portions is prepared, a semiconductor chip is mounted on each of the product formation portions, a sealing body is formed to integrally cover the plurality of product formation portions on the wiring board, and the wiring board is divided into the individual product formation portions.

However, such a semiconductor device has a problem that a wiring board is susceptible to warpage due to the fact that sealing resin is caused to shrink more than the wiring board due to cure shrinkage of the sealing resin.

The problem of warpage of the wiring board is also caused by the fact that the sealing body is formed by injecting a sealing resin through a gate during a transfer molding process, resulting in uneven distribution of filler (spherical glass members).

Furthermore, according to the related art, a plurality of gates are provided in a central part of the cavity for injecting the sealing resin through the gates. Therefore, in the same manner as described above, distribution of the filler will differ between the central part where the gates are provided and the opposite end parts of the cavity, when viewed in plan view. For example, there may be more filler in the opposite end parts of the cavity than in the central part where the gates are provided. This uneven distribution of the filler in the sealing body also leads to warpage of the wiring board.

If the warpage occurs in the wiring board, as described in the above, it may lead to deteriorated transportability of the wiring board or lowered positioning precision of the wiring board. Furthermore, the deteriorated transportability of the wiring board may cause deterioration in manufacturing efficiency, and the lowered positioning precision may cause deterioration in ball mounting accuracy or board cutting accuracy, possibly resulting in generation of defectives.

Moreover, warpage may occur also in a semiconductor device which has been assembled by the method as described above.

A semiconductor device of an MCP (Multi Chip Package) type or the like has a plurality of semiconductor chips mounted in layers, which increases the thickness of the sealing resin as well. The increased thickness of the sealing body makes more serious the problem of the warpage caused by the cure shrinkage of the sealing resin or uneven distribution of the filler.

Japanese Laid-Open Patent Publication Nos. 2001-44229 and 2001-44324 disclose a technology to reduce the warpage of a wiring board by forming a sealing body, divided into sections, so as to collectively cover a plurality of product formation portions.

However, although the formation of the divided sections of the sealing body on the wiring board alleviates the warpage of the wiring board to some extent, warpage will occur in each part of the wiring board corresponding to each section of the sealing body.

Furthermore, in a recent trend, the size of a wiring board has been increased to increase the number of products obtainable from a wiring board, and hence the size of a sealing body has also been increased. As a result, the problem of warpage has become even more serious.

If the sealing body is divided into a greater number of sections for the purpose of reducing the warpage, the wiring board will come into contact with molding dies over a greater area, resulting in reduced number of products obtainable from the wiring board.

For example, Japanese Laid-Open Patent Publication No. H10-326800 discloses a technology in which a sealing resin is formed on a wiring board which is in a warped state, so that the warpage is reduced caused by the difference in heat shrinkage between the wiring board and the sealing resin.

For example, Japanese Laid-Open Patent Publication No. 2007-281374 discloses a technology in which there is provided, between each chip and external terminal on a wiring board, a local deformation member having a different coefficient of thermal expansion from that of the wiring board, so that the local deformation member is deformed in an opposite direction from the warpage occurring in the chip mounting region.

SUMMARY

However, none of the technologies described above takes into consideration the problem of warpage possibly caused by cure shrinkage of sealing resin during formation of a sealing body and uneven distribution of filler of the sealing resin.

The present invention seeks to solve one or more of the above problems, or to improve upon those problems at least in part.

In one embodiment, an intermediate structure for semiconductor devices includes a wiring board, a plurality of semiconductor chips mounted on the wiring board, and a sealing body for collectively sealing the plurality of semiconductor chips and having a region with a different thickness.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Firstly, in order to facilitate the understanding of this invention, the problems of the related art will be described in detail with reference to FIGS. 16A and 16B.

Figure 16A:
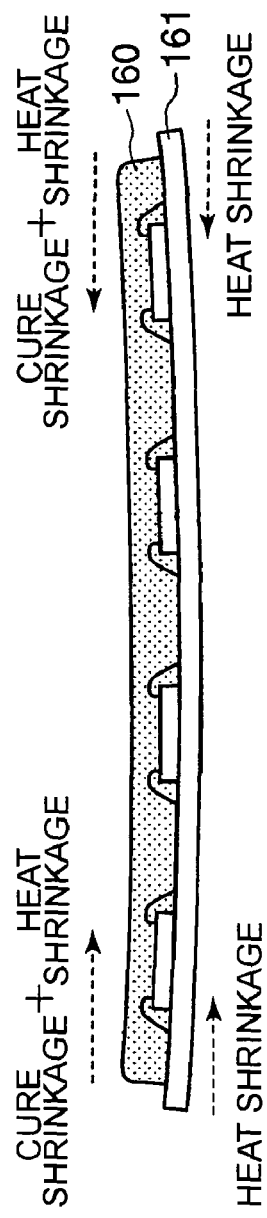
FIGS. 16A and 16B are diagrams for explaining problems of the related art.
Figure 16B:
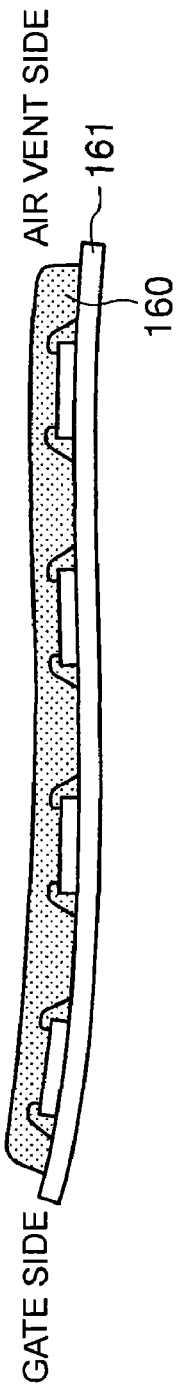

As shown in FIG. 16A, a cavity integrally covering a plurality of product formation portions is filled with a sealing resin by transfer molding, and a sealing body is formed by thermally curing the sealing resin 160. The sealing resin 160, undergoing both cure shrinkage and heat shrinkage, exhibits greater shrinkage than the heat shrinkage of a wiring board 161. Thus, the sealing resin 160 shrinks more than the wiring board 161 does, due to the cure shrinkage of the sealing resin 160. This may lead to a problem warpage of the wiring board 161 as shown in FIG. 16A.

In addition to the problem described above, there is another problem that since the sealing body is formed by injecting the sealing resin 160 through a gate by transfer molding, distribution of filler (spherical glass members) will differ between the gate side and the air vent side of the sealing body. More specifically, the filler contained in the sealing resin 160 will flow more to the air vent side when the sealing resin 160 is injected into the cavity through the gate by transfer molding, resulting in distribution of more filler on the air vent side than on the gate side of the sealing body.

Such uneven distribution of the filler will disrupt the planar balance of the sealing body, possibly resulting in a problem warpage of the wiring board 161. For example, as shown in FIG. 16B, uneven distribution of the filler may cause warpage of the negative direction (toward the sealing body) on the gate side where the amount of distributed filler is smaller, and in the positive direction (toward the wiring board) in the air vent side where the amount of distributed filler is greater.

Furthermore, according to the related art, a plurality of gates are provided in a central part of the cavity and the sealing resin is injected through these gates. This also results in planar difference in distribution of the filler between the opposite sides of the cavity and the central part thereof where the gates are provided. For example, the amount of the distributed filler becomes greater in the opposite sides of the cavity than in the central part where the gates are provided. This uneven distribution of the filler in the sealing body will also lead warpage of the wiring board 161.

Such warpage of the wiring board 161 may lead to lowered transportability of the wiring board 161 or deterioration in positioning precision of the wiring board 161. Further, the lowered transportability of the wiring board 161 may lead to lowered manufacturing efficiency. Furthermore, the deterioration in positioning precision may lead to lowered ball mounting accuracy or lowered board cutting accuracy, possibly resulting in generation of defectives.

This invention has been made to solve these problems of the related art. Exemplary embodiments of this invention will be described in detail with reference to the accompanying drawings.

First Exemplary Embodiment

Referring to FIG. 1 to 7, a manufacturing method of a BGA (Ball Grid Array) type semiconductor device according to a first exemplary embodiment of this invention will be described.

Figure 1A:
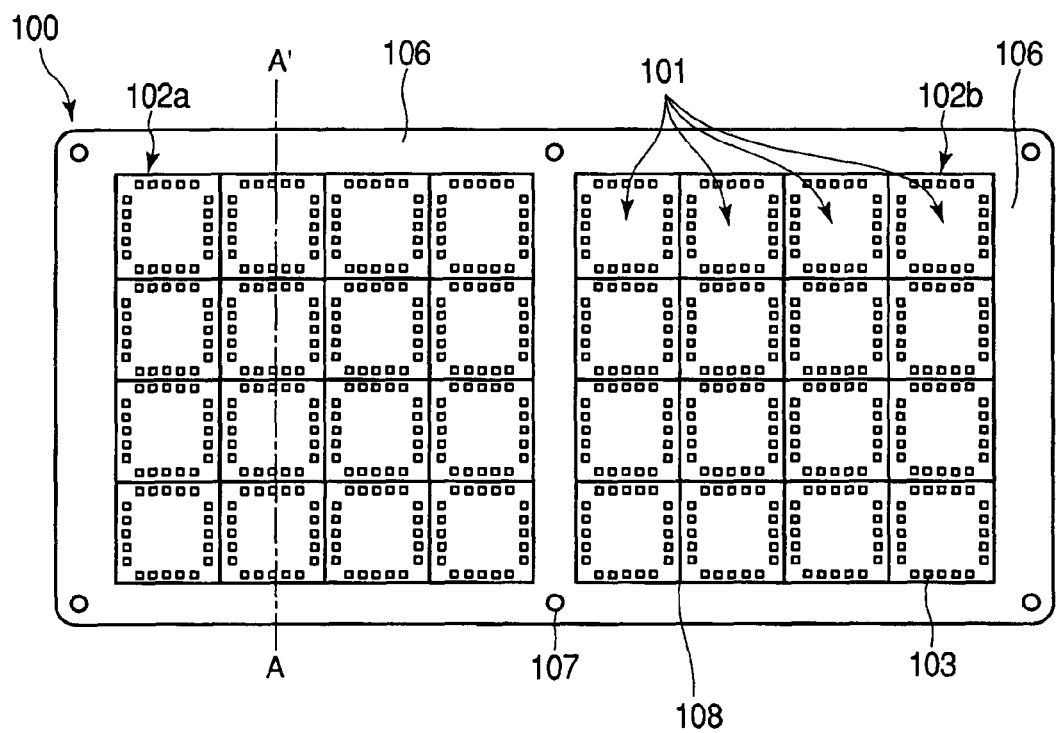
FIG. 1A is a plan view showing a schematic configuration of a wiring board for use in manufacture of a semiconductor device according to a first embodiment of this invention.
Figure 1B:
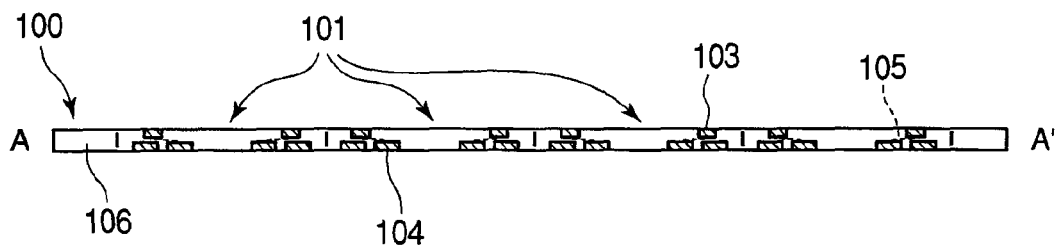
FIG. 1B is a cross-sectional view showing a schematic configuration of the wiring board for use in manufacture of a semiconductor device according to the first embodiment of this invention.

A wiring board 100 is for example a 0.2 mm thick glass epoxy wiring board, having a plurality of product formation portions 101 arranged in matrix as shown in FIGS. 1A and 1B. The product formation portions 101 arranged in matrix make up two areas 102a and 102b each composed of 4×4, or 16 product formation portions 101, for example. Each of the product formation portions 101 on the wiring board 100 is formed with a predetermined wiring pattern (not shown), and the wiring pattern is partially covered with an insulation film (not shown) made of a solder resist, for example.

A plurality of connection pads 103 are formed on the exposed part of the wiring pattern on one surface of the product formation portion 101 not covered with the solder resist. A plurality of lands 104 are formed on the exposed part of the wiring pattern on the other side of the product formation portions 101 not covered with the solder resist. Each of the connection pads 103 is electrically connected to the land 104 corresponding thereto by means of a wire 105 of the wiring board 100. A frame portion 106 is provided on the periphery of the areas 102a and 102b in which the product formation portions 101 are arranged in matrix. Positioning holes 107 are provided in the frame portion 106 at predetermined intervals so as to enable transportation and positioning of the wiring board. A dicing line 108 is defined between the product formation portions 101. The wiring board 100 is prepared in this manner as shown in FIGS. 1A and 1B.

Figure 2A:
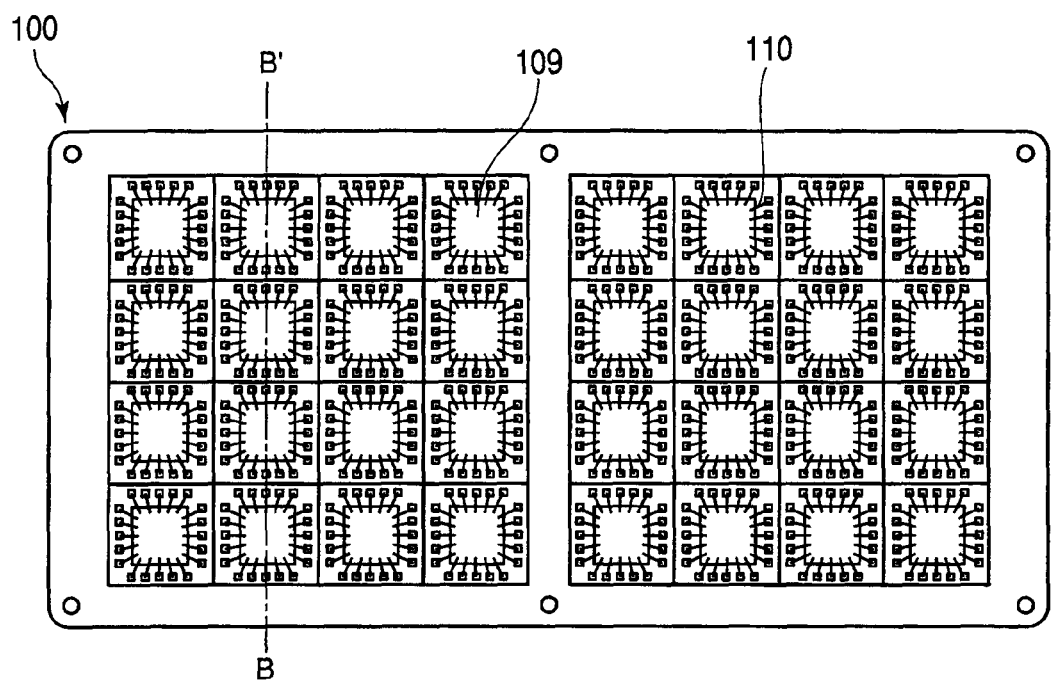
FIG. 2A is a plan view showing a die bonding process.
Figure 2B:
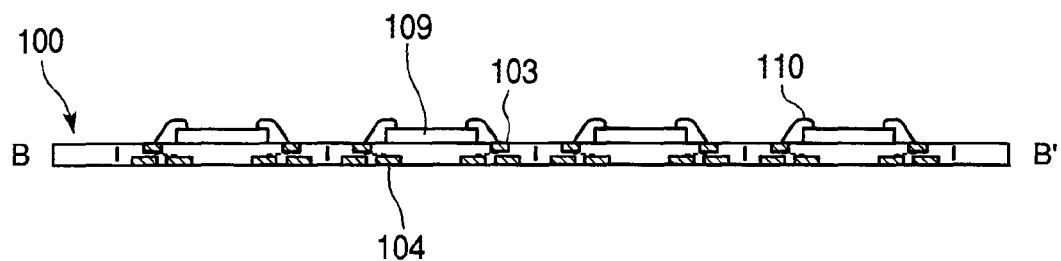
FIG. 2B is a cross-sectional view showing the die bonding process.

Next, as shown in FIGS. 2A and 2B, the wiring board 100 is transferred to a die bonding process, in which semiconductor chips 109 are mounted thereon.

Each of the semiconductor chips 109 has a logic circuit or memory circuit formed on one surface of a Si substrate, and a plurality of electrode pads (not shown) formed in the vicinity of the periphery of the chip. A passivation film (not shown) is formed to cover the one surface of the semiconductor chip, except the regions where the electrode pads are formed, for the purpose of protection of the circuit formation surface.

In the die bonding process, each of the semiconductor chips 109 is bonded, at the rear surface thereof (the opposite surface with respect to the surface where the electrode pads are formed), to a substantially central part of each of the product formation portions 101 on one surface of the wiring board 100 by means of an insulating adhesive or DAF (Die Attached Film) with the use of a die bonding device not shown. Once the semiconductor chips 109 are mounted on all the product formation portions 101, the wiring board 100 is transferred to a wire bonding process.

In the wire bonding process, each of the electrode pads formed on one surface of the semiconductor chips 109 is connected to the corresponding connection pad 103 formed in the product formation portions by means of a conductive wire 110. The wire 110 is made of Au, Cu or the like. The wire 110 is formed with a ball at an end thereof by being molten by a wire bonding device (not shown). This end of the wire 110 is connected to the electrode pad of the semiconductor chip 109 by ultrasonic thermocompression bonding. The wire 110 is then extended, forming a predetermined loop shape, and the distal end of the wire 110 is bonded to the corresponding connection pad 103 by ultrasonic thermocompression bonding. Once all the product formation portions 101 have been wire connected, the wiring board 100 has a configuration as shown in FIGS. 2A and 2B, and is transferred to a sealing process.

Figure 3A:
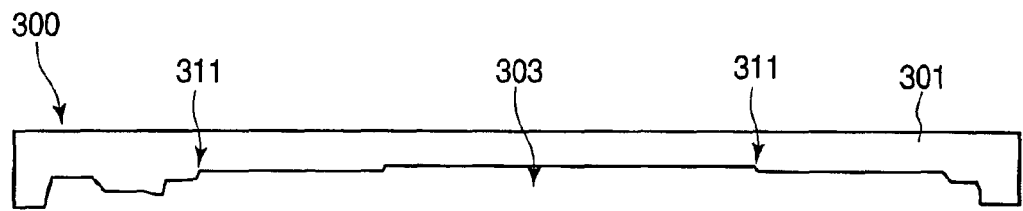
FIGS. 3A to FIG. 3C are cross-sectional views showing a schematic configuration of a molding device (transfer molding device) for use in a sealing process of a semiconductor device according to the first embodiment of the invention.
Figure 3B:
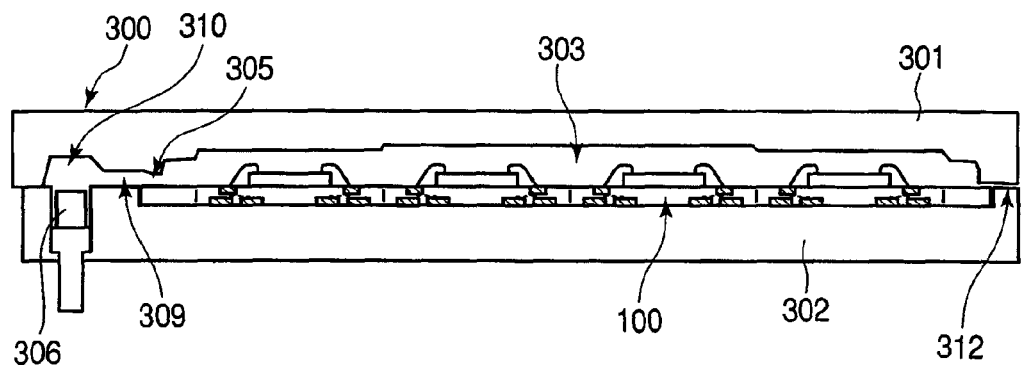
Figure 3C:
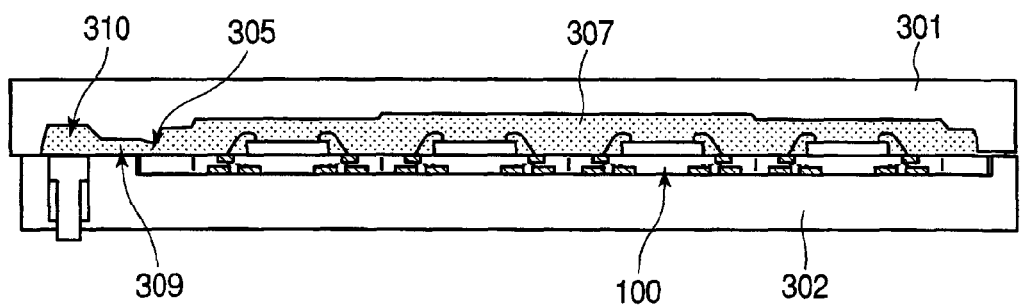

Referring to FIGS. 3A to 3C, a sealing process for a semiconductor device according to the first exemplary embodiment of this invention will be described.

As shown in FIG. 3A, a molding device 300 has molding dies composed of an upper die 301 and a lower die 302. The upper die 301 has a cavity 303 formed therein, and the lower die 302 has a recess 304 for receiving the wiring board 100 mounted therein. The cavity 303 is formed to have various depths as shown in FIG. 3B. In the first exemplary embodiment, the cavity 303 is formed such that the depth becomes smaller stepwise from its central part toward the peripheral part. More specifically, the cavity is formed such that its depth is reduced stepwise from the central part of the cavity 303 toward the side of a gate 305, and from the central part of the cavity 303 toward the side of an air vent 312.

The wiring board 100 in which the wire bonding has been completed (see FIG. 2A and FIG. 2B) is set in the recess 304 of the lower die 302 as shown in FIG. 3A. The wiring board 100 is then clamped between the upper die 301 and the lower die 302, whereby the cavity 303 and the gate 305 having predetermined sizes are formed above the wiring board 100. Since the MAP method is employed in this first embodiment, the cavity 303 is formed to be large enough to collectively cover the plurality of product formation portions 101. In addition, the cavity 303 is divided into two in this embodiment. A tablet 306 (resin tablet) is supplied into a pot in the lower die 302 and is thermally molten.

As shown in FIG. 3C, the molten sealing resin 307 is injected into the cavity 303 through the gate 305 by means of a plunger 308. After filling the cavity 303 with the sealing resin 307, the sealing resin 307 is cured at a predetermined temperature, for example at 180° C., whereby the sealing resin is hardened and a sealing body is formed.

The wiring board 100 is taken out of the molding device 300 (molding dies), and the sealing body is completely hardened by reflowing the same at a predetermined temperature, for example at 240° C.

Figure 4A:
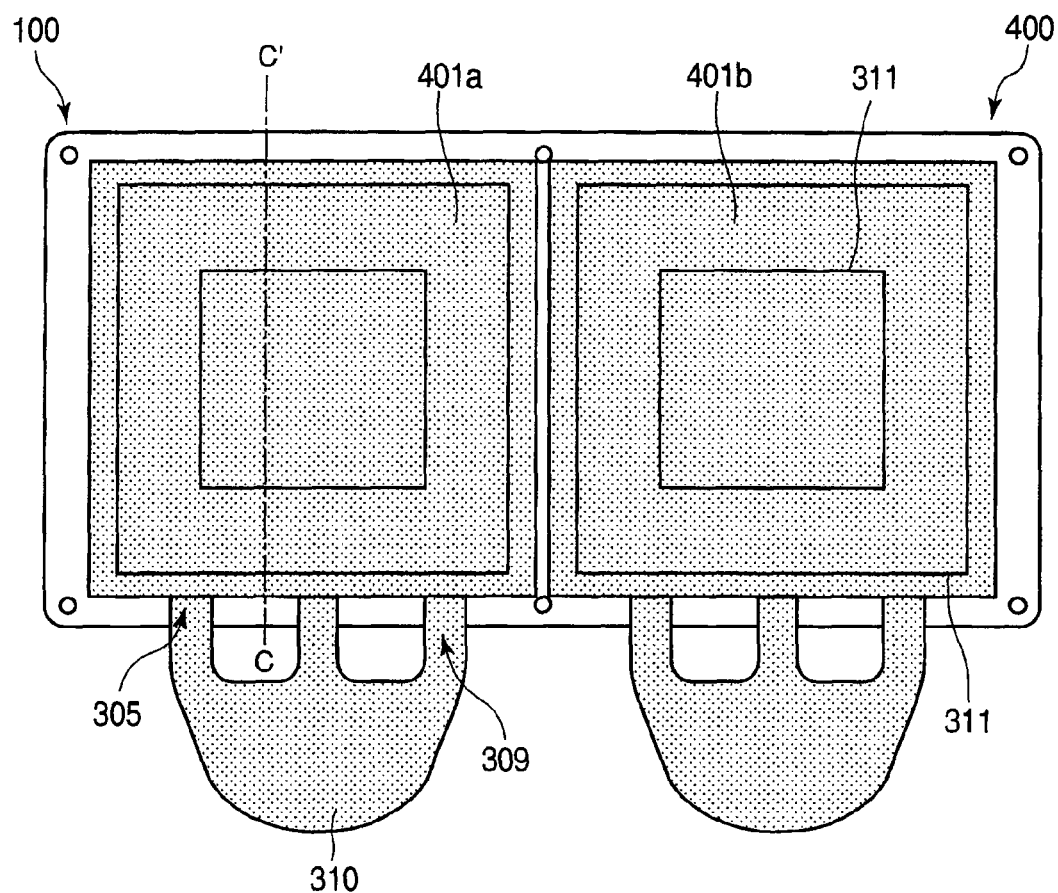
FIG. 4A is a plan view showing an intermediate structure of the first embodiment of the invention.
Figure 4B:
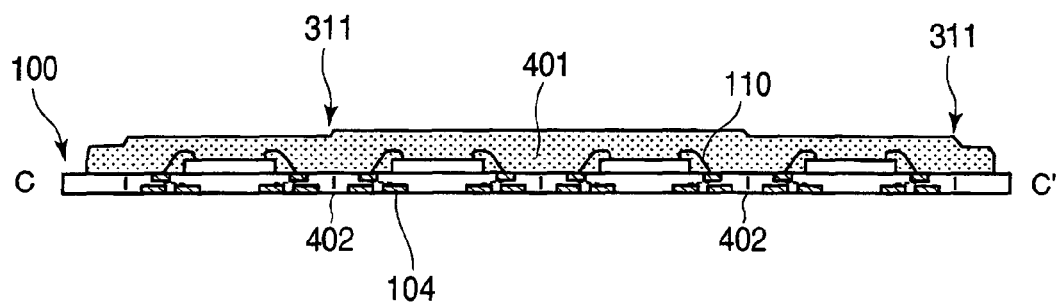
FIG. 4B is a cross-sectional view showing the intermediate structure of the first embodiment.

As a result, an intermediate structure 400 for semiconductor devices is obtained as shown in FIGS. 4A and 4B, wherein two sealing bodies 401a and 401b each having a region with a different resin thickness are formed in the two areas 102a and 102b of the product formation portions 101 on the wiring board 100 (see FIGS. 1A and 1B). The sealing resin 307 on the gates 305, runners 309 and culls 310 connected to the sealing bodies 401a and 401b of the intermediate structure 400 is removed.

Each of the sealing bodies 401a and 401b of the intermediate structure 400 is formed such that the resin thickness is reduced stepwise from its central part toward its peripheral part. In this embodiment, steps 311 where the resin thickness differs are arranged along dicing lines 402, while the top surfaces of the sealing bodies 401a of 401b of the product formation portions 101 are formed flat.

Thus, each of the sealing bodies 401a and 401b is formed on the wiring board 100 such that the resin thickness is smaller in the peripheral part than in the central part thereof. This makes it possible to minimize the cure shrinkage of the sealing bodies 401a and 401b and to reduce the warpage of the intermediate structure 400.

Figure 5A:
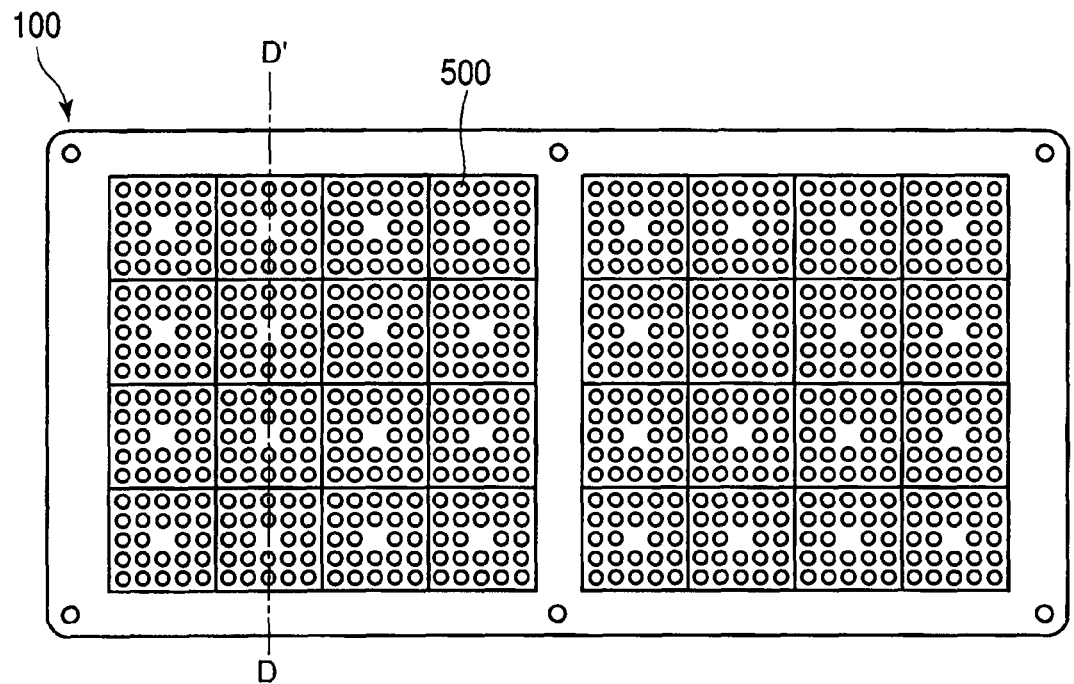
FIG. 5A is a plan view showing a ball mounting process.
Figure 5B:
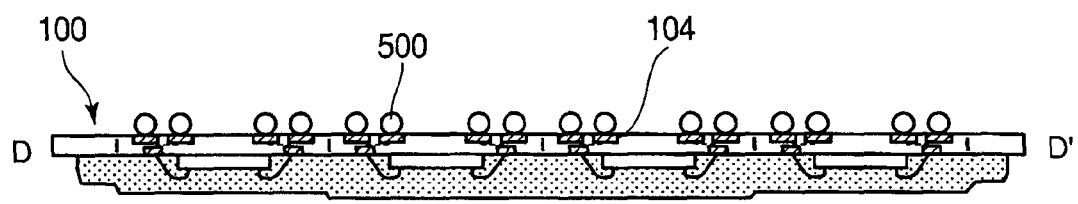
FIG. 5B is a cross-sectional view showing the ball mounting process.

The wiring board 100 is then transferred to a ball mounting process and, as shown in FIGS. 5A and 5B, a conductive solder ball 500 is mounted on each of the plurality of lands 104 arranged in matrix on the rear surface of the wiring board 100, so that bump electrodes serving as external terminals are formed.

In the ball mounting process, a suction mechanism (not shown) having a plurality of suction holes, which are formed in accordance with the arrangement of the lands 104 on the wiring board 100, is used to hold the solder balls 500 made of solder or the like at the suction holes. The solder balls 500 thus held are collectively mounted on the lands 104 on the wiring board 100 by means of flux.

After mounting the solder balls 500 on all of the product formation portions 101, the wiring board 100 is subjected to reflow to thereby form bump electrodes (external terminals). The sealing bodies 401a and 401b are each formed such the resin thickness in its peripheral part is smaller than that in its central part in order to reduce the warpage of the intermediate structure 400. This makes it possible to mount the solder balls 500 in a desirable manner.

The wiring board 100 having the solder balls 500 mounted thereon is transferred to a board dicing process.

Figure 6A:
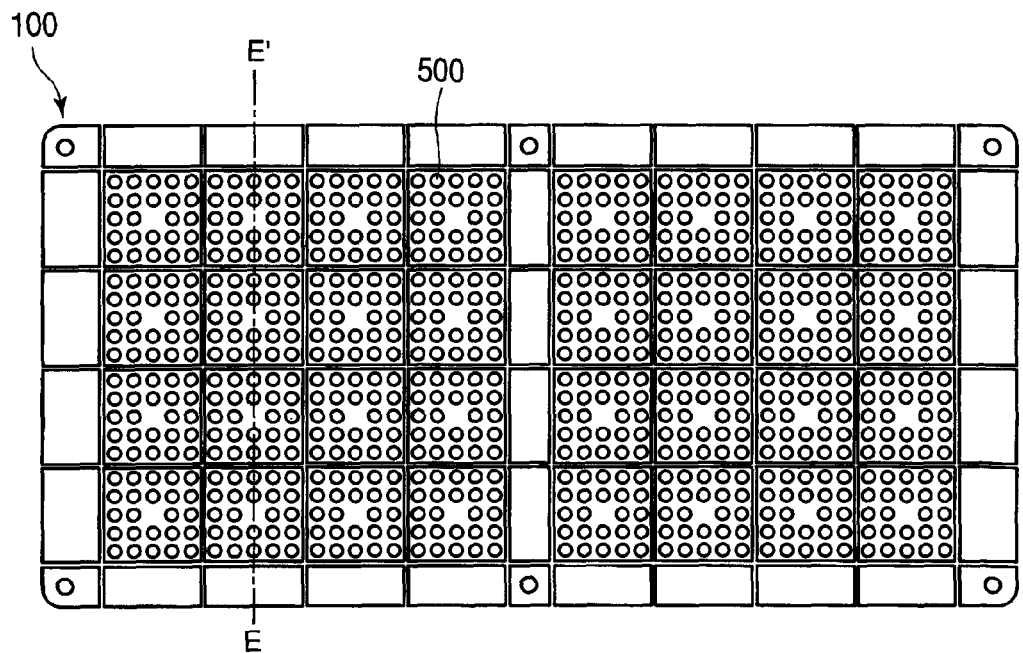
FIG. 6A is a plan view showing a board dicing process.
Figure 6B:
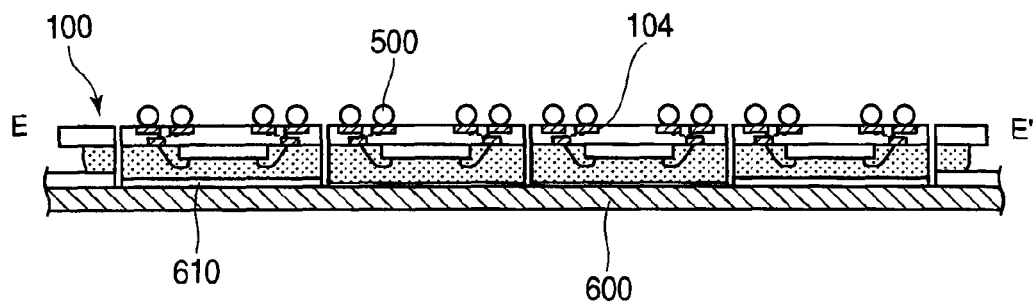
FIG. 6B is a cross-sectional view showing the board dicing process.
Figure 7:
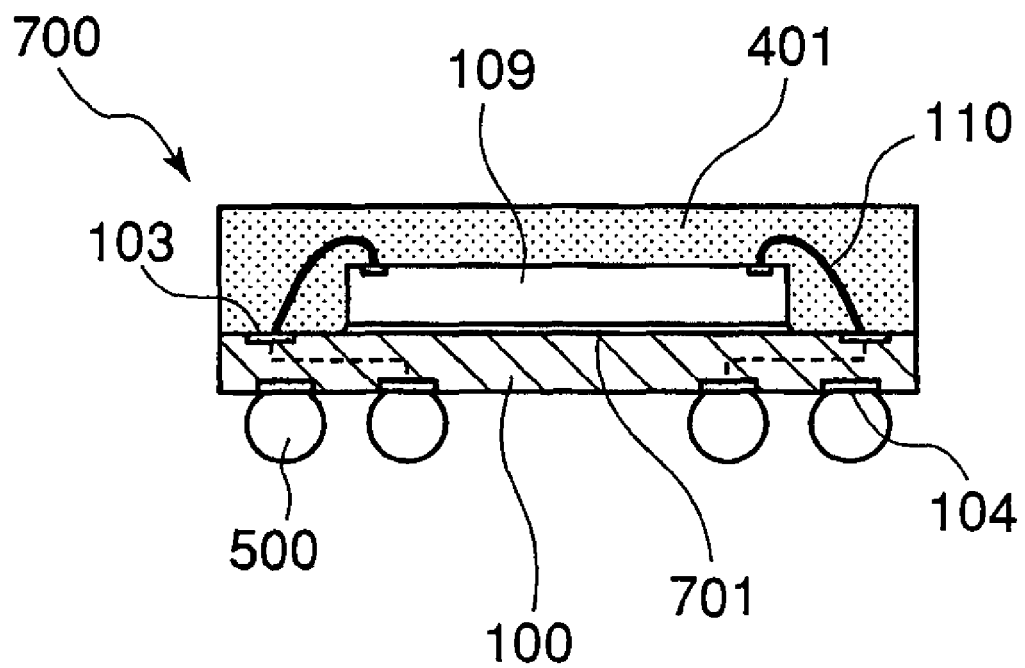
FIG. 7 is a cross-sectional view showing a semiconductor device obtained after the board dicing process.

As shown in FIGS. 6A and 6B, the wiring board 100 is cut along the dicing lines 402 (see FIG. 4A and FIG. 4B) so that the product formation portions 101 are separated individually. In the board dicing process, the surface of the wiring board 100 where the sealing bodies 401a and 401b are formed is bonded to a dicing tape 600 via an adhesive layer 610 so that the wiring board 100 is supported by the dicing tape 600. Then, the wiring board 100 is cut lengthwise and breadthwise along the dicing lines 402 with the use of a dicing blade of a dicing device (not shown), so that the product formation portions 101 are separated from each other. After the cutting and separation, a semiconductor device 700 as shown in FIG. 7 is obtained by picking it up from the dicing tape 600. As described above, the semiconductor chip 109 is adhesively bonded onto the wiring board 100 by means of an adhesive 701.

Second Exemplary Embodiment

Referring to FIGS. 8A to 8C and FIGS. 9A and 9B, a sealing process for semiconductor devices according to a second exemplary embodiment of the invention will be described.

The processes up to the wire bonding process are the same as in the first embodiment, and hence description thereof will be omitted.

A sealing process for semiconductor devices according to the second exemplary embodiment of this invention will be described.

Figure 8A:
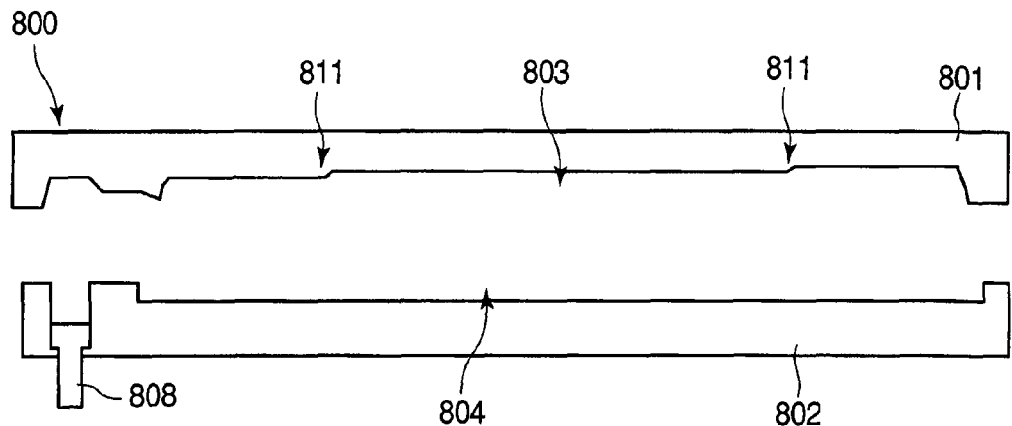
FIGS. 8A to 8C are cross-sectional views showing a schematic configuration of a molding device (transfer molding device) for use in a sealing process of a semiconductor device according to a second embodiment of this invention.

A molding device 800 has molding dies composed of an upper die 801 and a lower die 802 as shown in FIG. 8A. The upper die 801 is formed with a cavity 803, and the lower die 802 is formed with a recess 804 for receiving a wiring board 100 mounted therein. The cavity 803 is formed to have various depths as shown in FIG. 8A. In the second embodiment, the cavity 803 is formed such that the depth is increased stepwise from the side of a gate 805 toward the side of an air vent 812.

Figure 8B:
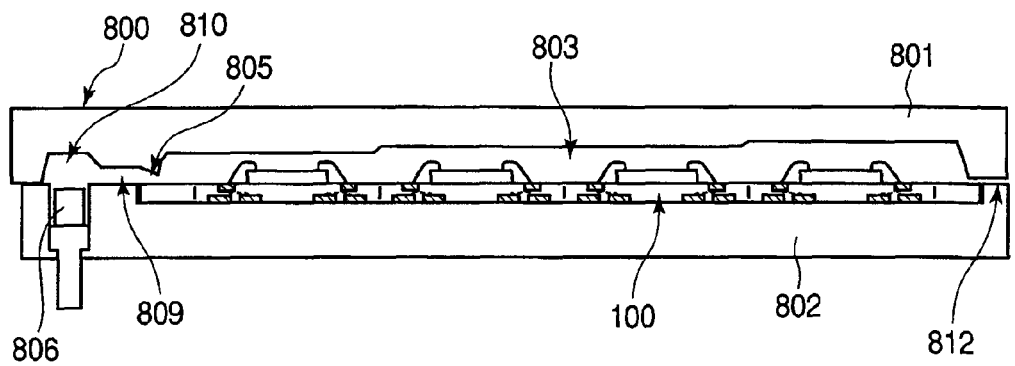

The wiring board 100, in which the wire bonding has been completed, is set in the recess 804 of the lower die 802 as shown in FIG. 8B. The wiring board 100 is clamped between the upper die 801 and the lower die 802, so that the cavity 803 and gate 805 having predetermined sizes are formed above the wiring board 100. Since the MAP method is employed in this second embodiment, the cavity 803 is formed to be large enough to collectively cover the plurality of product formation portions 101. Additionally, in this embodiment, the cavity 803 is divided into two. A tablet 806 (resin tablet) is supplied into a pot of the lower die 802 and thermally molten.

Figure 8C:
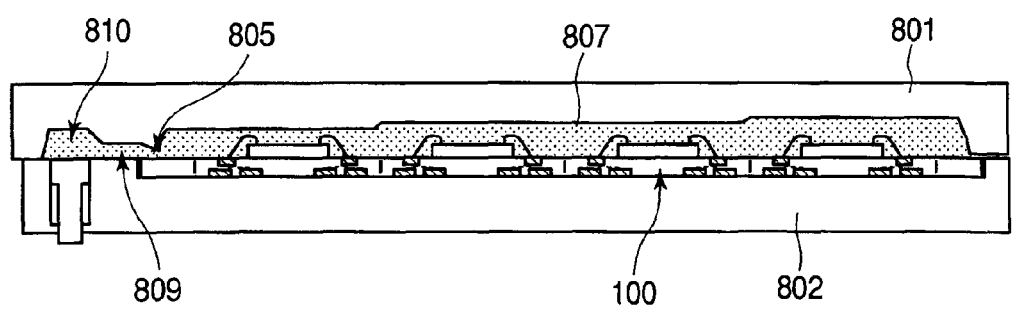

Then, as shown in FIG. 8C, the molten sealing resin 807 is injected into the cavity 803 through the gate 805 by means of a plunger 808. After filling the cavity 803 with the sealing resin 807, the sealing resin 807 is cured at a predetermined temperature, for example at 180° C., so that the sealing resin 807 is hardened and sealing bodies 901a and 901b are formed.

Figure 9A:
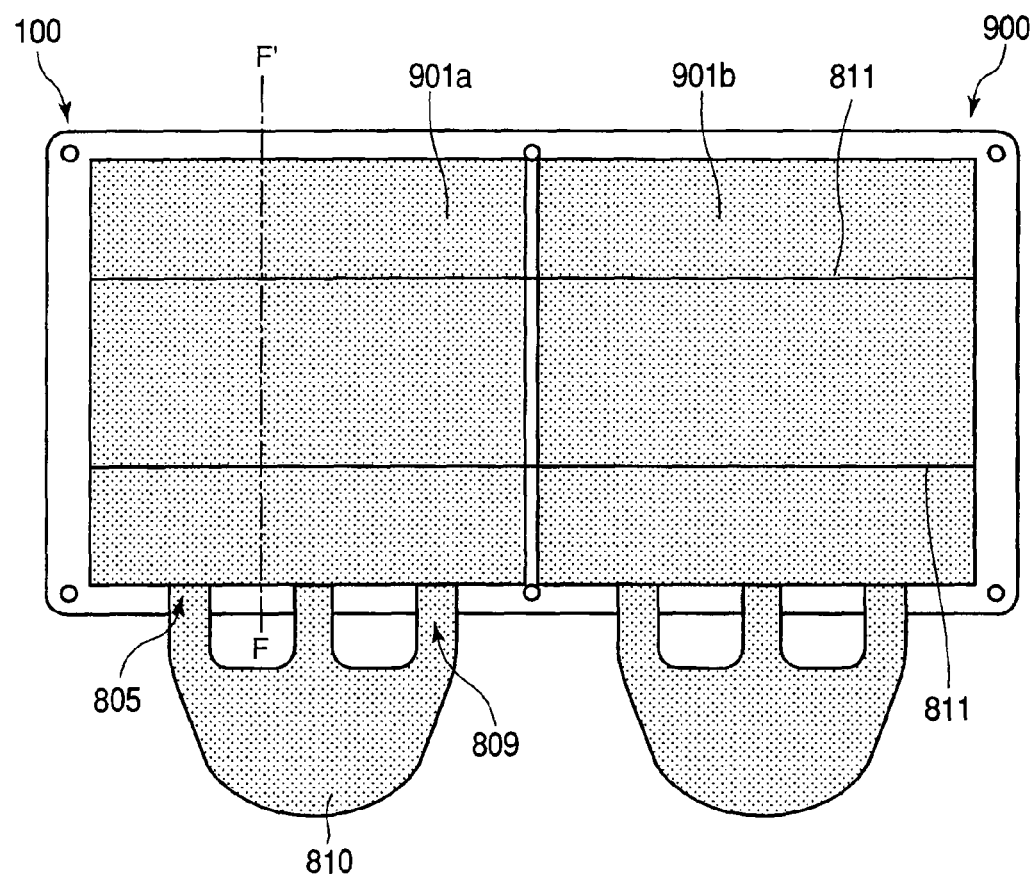
FIG. 9A is a plan view showing an intermediate structure of the second embodiment.
Figure 9B:
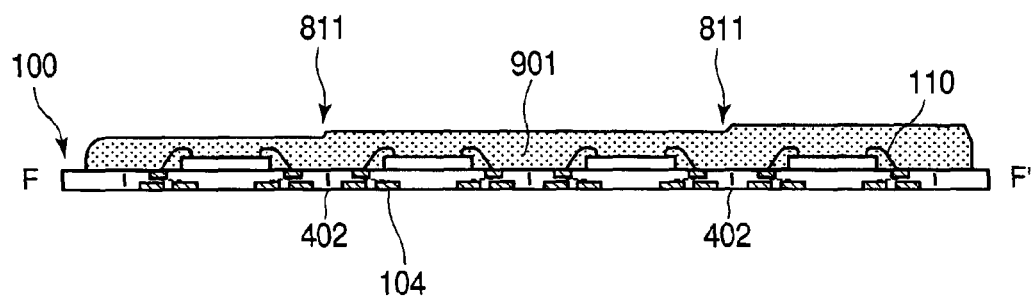
FIG. 9B is a cross-sectional view showing the intermediate structure of the second embodiment.

The wiring board 100 is then taken out of the molding device 800 (molding dies) and subjected to reflow at a predetermined temperature, for example at 240° C., whereby the sealing bodies 901a and 901b are completely hardened. As a result, an intermediate structure 900 for semiconductor devices is obtained as shown in FIGS. 9A and 9B, wherein two sealing bodies 901a and 901b each having a region with a different resin thickness are formed in the two respective areas 102a and 102b of the product formation portions 101 on the wiring board 100 (see FIGS. 1A and 1B).

The sealing resin 807 on the gates 305, runners 809 and culls 810 connected to the sealing bodies 901a and 901b of the intermediate structure 900 is removed.

Each of the sealing bodies 901a and 901b of the intermediate structure 900 is formed such that the resin thickness is increased stepwise from the side of a gate 805 toward the side of an air vent 812. In this embodiment, steps 811 where the resin thickness differs are arranged along dicing lines 402, while the top surfaces of the sealing bodies 901a and 901b of the product formation portions 101 are formed flat.

Thus, each of the sealing bodies 901a and 901b is formed on the wiring board 100 such that the resin thickness is smaller on the side of the gate 805 than on the side of the air vent 812. This makes it possible to minimize the cure shrinkage of the sealing bodies 901a and 901b on the side of the gates 805. As a result, it is made possible to minimize the warpage of the intermediate structure 900 attributable to uneven distribution of the filler in the sealing bodies 901a and 901b caused by the injection of the resin by transfer molding.

Then, like in the first exemplary embodiment, the wiring board 100 having the sealing bodies 901a and 901b formed thereon is subjected to the ball mounting process and the board dicing process, and a semiconductor device 700 as shown in FIG. 7 is obtained.

Third Exemplary Embodiment

Referring to FIGS. 10A to 10C, and FIGS. 11A and 11B, a sealing process for semiconductor devices according to a third exemplary embodiment of this invention will be described.

The processes up to the wire bonding processes are the same as in the first exemplary embodiment, and hence description thereof will be omitted.

A sealing process for semiconductor devices according the third exemplary embodiment of this invention will be described.

Figure 10:
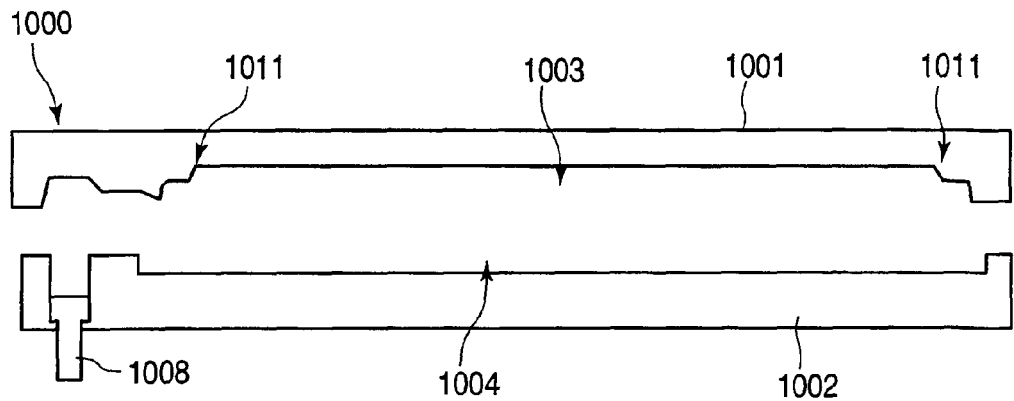
FIGS. 10A to 10C are cross-sectional views showing a schematic configuration of a molding device (transfer molding device) for use in a sealing process of a semiconductor device according to a third embodiment of this invention.
Figure 10:
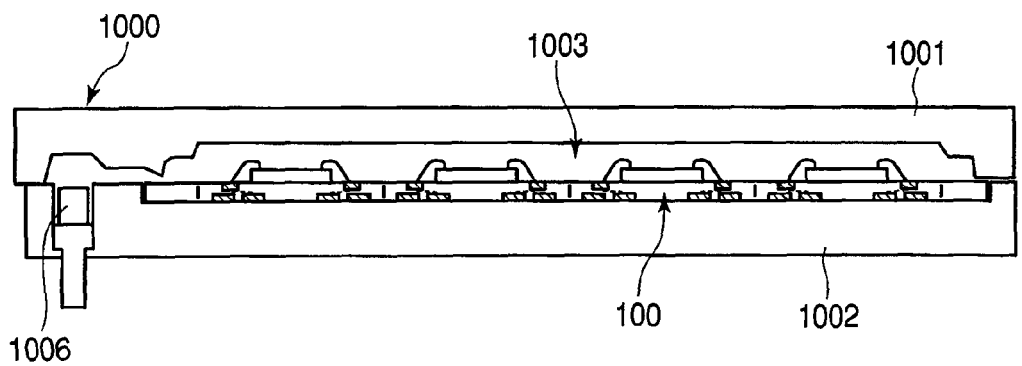
Figure 10:
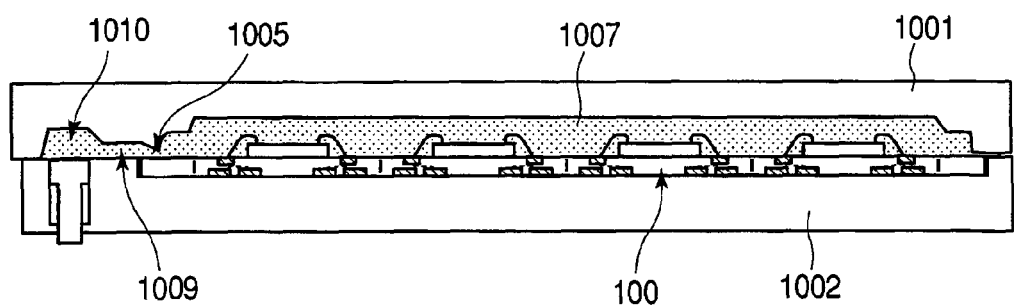

A molding device 1000 has molding dies composed of an upper die 1001 and a lower die 1002 as shown in FIG. 10A. The upper die 1001 is formed with a cavity 1003, whereas the lower die 1002 is formed with a recess 1004 for receiving the wiring board 100 mounted therein.

The cavity 1003 is formed to have various depths as shown in FIG. 10A. In the third embodiment, the cavity 1003 is formed to have a smaller depth in its part corresponding to the frame portion 106 of the wiring board 100 (see FIGS. 1A and 1B) than in its part corresponding to the product formation portions 101 (see FIGS. 1A and 1B).

The wiring board 100, in which the wire bonding has been completed, is set in the recess 1004 of the lower die 1002 as shown in FIG. 10B. The wiring board 100 is then clamped between the upper die 1001 and the lower die 1002, so that the cavity 1003 and a gate 1005 having predetermined sizes are formed above the wiring board 100. Since this embodiment employs the MAP method, the cavity 1003 is formed to be large enough to collectively cover the plurality of product formation portions 101. Further, in this embodiment, the cavity 1003 is divided into two. A tablet 1006 (resin tablet) is then supplied to a pot of the lower die 1002, and is thermally molten.

Then, as shown in FIG. 10C, the molten sealing resin 1007 is injected into the cavity 1003 through the gate 1005 by means of a plunger 1008. After filling the cavity 1003 with the sealing resin 1007, the sealing resin 1007 is cured at a predetermined temperature, for example at 180° C., whereby the sealing resin 1007 is hardened and sealing bodies 1101a and 1101b are formed.

Figure 11A:
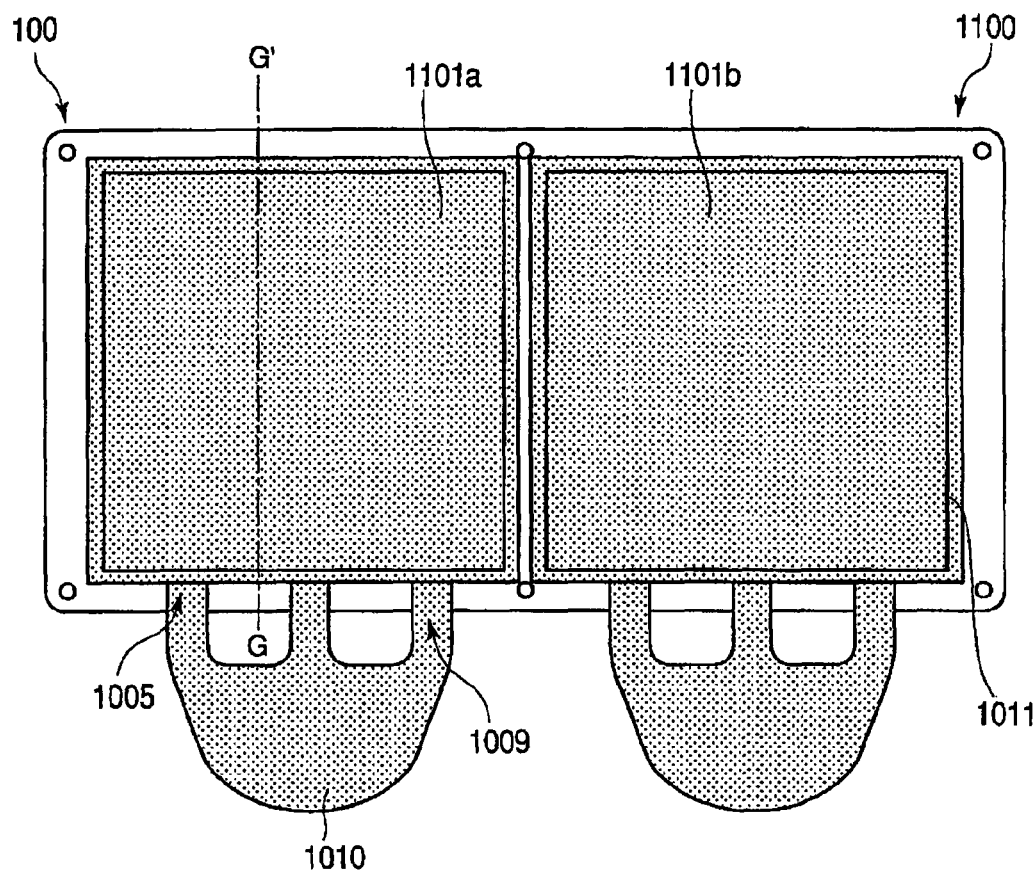
FIG. 11A is a plan view showing an intermediate structure of the third embodiment.
Figure 11B:
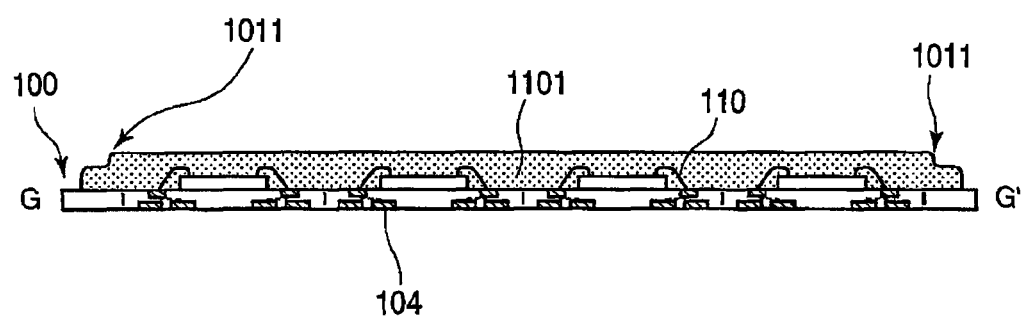
FIG. 11B is a cross-sectional view showing the intermediate structure of the third embodiment.

Then, the wiring board 100 is taken out of the molding device 1000 (molding dies), and subjected to reflow at a predetermined temperature, for example at 240° C., whereby the sealing bodies 1101a and 1101b are completely hardened. As a result, an intermediate structure 1100 for semiconductor devices is obtained as shown in FIGS. 11A and 11B, wherein two sealing bodies 1101a and 1101b each having a part with a different resin thickness are formed in the two respective areas 102a and 102b of the product formation portions 101 on the wiring board 100 (see FIGS. 1A and 1B). The sealing resin 1007 on the gates 1005, runners 1009 and culls 1010 connected to the sealing bodies 1101a and 1101b of the intermediate structure 1100 is removed.

Each of the sealing bodies 1101a and 1101b of the intermediate structure 1100 is formed such that the resin thickness of its part corresponding to the frame portion 106 of the wiring board 100 (see FIGS. 1A and 1B) is smaller than the resin thickness of its part corresponding to the product formation portions 101 (see FIGS. 1A and 1B), whereby the cure shrinkage of the sealing bodies 1101a and 1101b can be minimized. Thus, like the first embodiment, the warpage of the intermediate structure 1100 can be reduced.

Further, in this third exemplary embodiment, the part of the sealing body having a different resin thickness is provided in correspondence with the frame portion 106. Therefore, the cavity for the product formation portions 101 can be used in common also for products having a different size of product formation portions 101.

Then, like the first exemplary embodiment, the wiring board 100 having the sealing bodies 1101a and 1101b formed thereon is subjected to the ball mounting process and the board dicing process, whereby a semiconductor device 700 as shown in FIG. 7 is obtained.

Fourth Exemplary Embodiment

Figure 12:
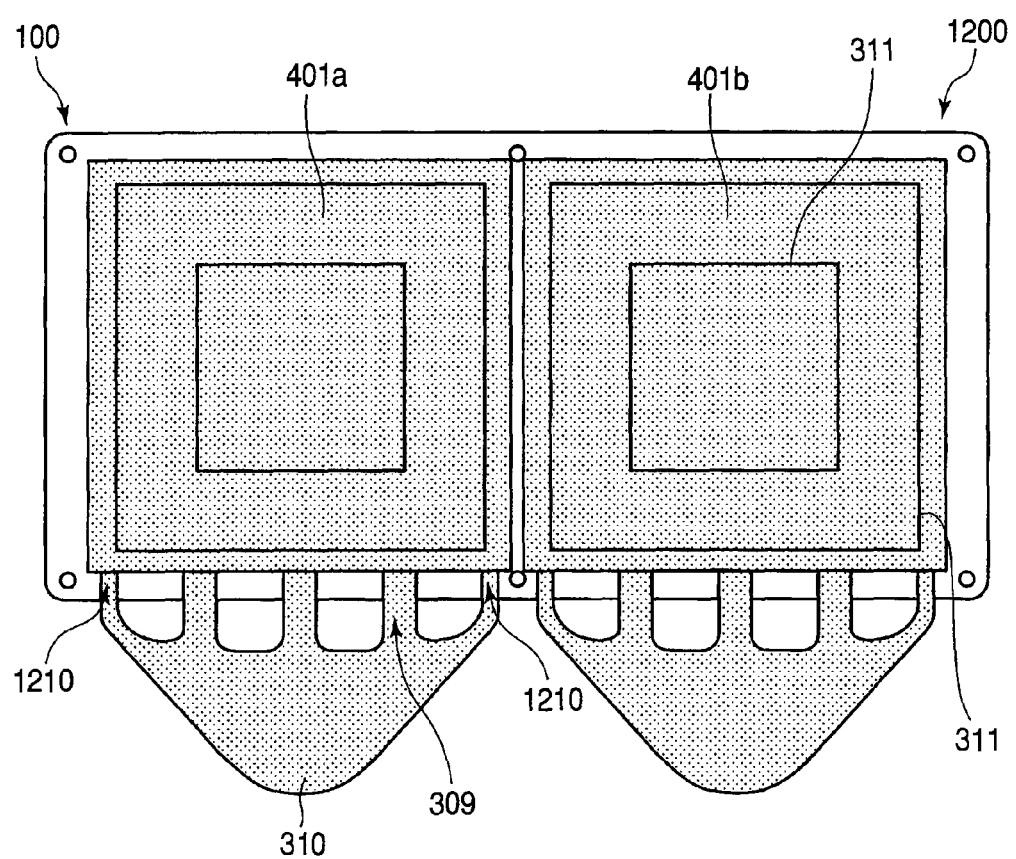
FIG. 12 is a plan view showing a schematic configuration of an intermediate structure formed by a sealing process according to a fourth embodiment of this invention.
Figure 13A:
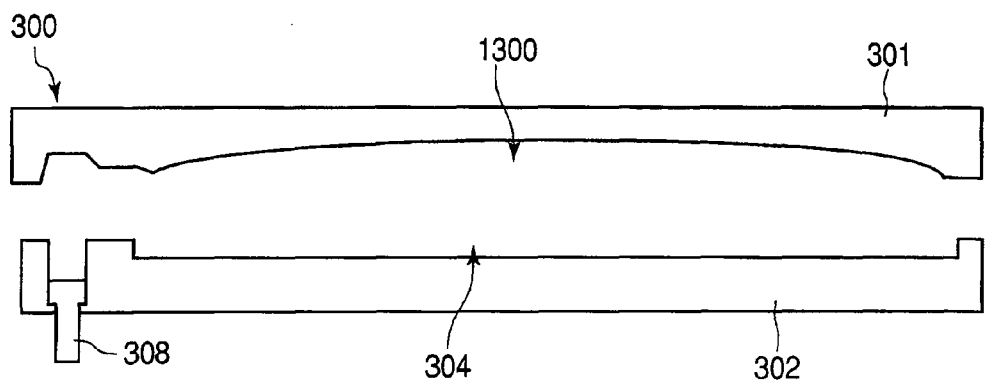
FIGS. 13A to 13D are cross-sectional views showing a schematic configuration of a molding device (transfer molding device) for use in a sealing process of a semiconductor device according to an alternative embodiment of the first embodiment of this invention.
Figure 13B:
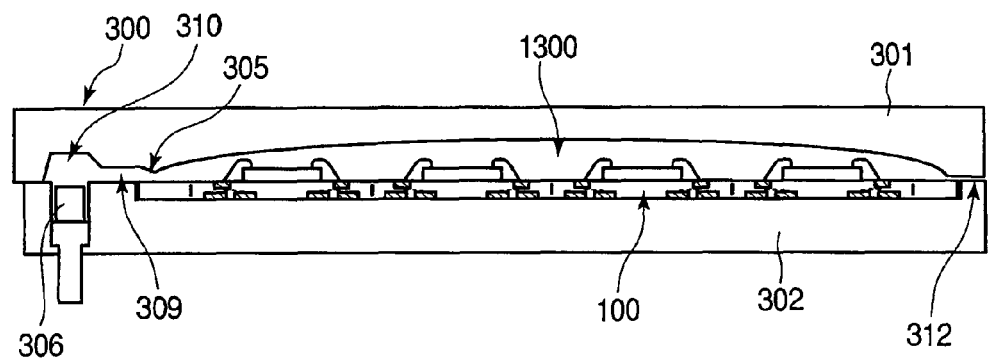
Figure 13C:
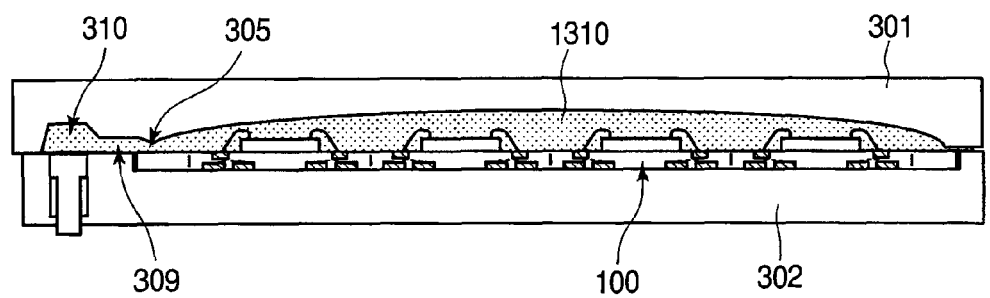
Figure 13D:
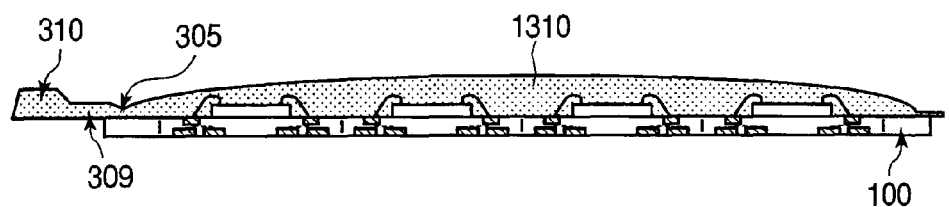
Figure 14A:
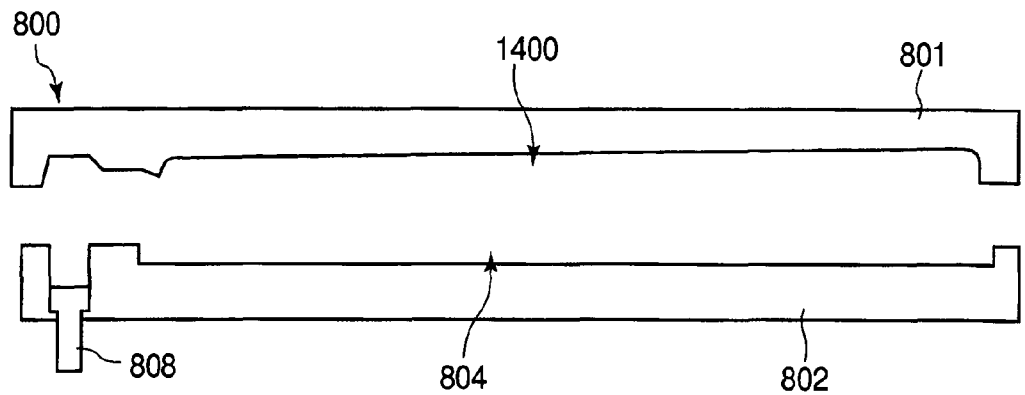
FIGS. 14A to 14D are cross-sectional views showing a schematic configuration of a molding device (transfer molding device) for use in a sealing process of a semiconductor device according to an alternative embodiment of the second embodiment of this invention.
Figure 14B:
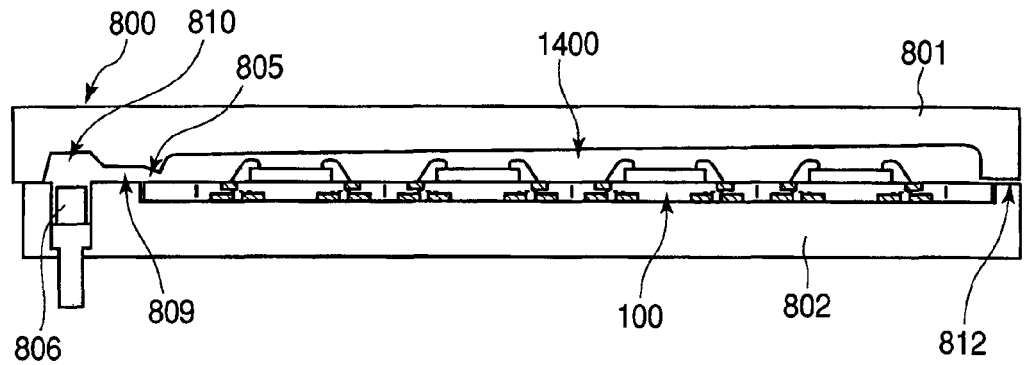
Figure 14C:
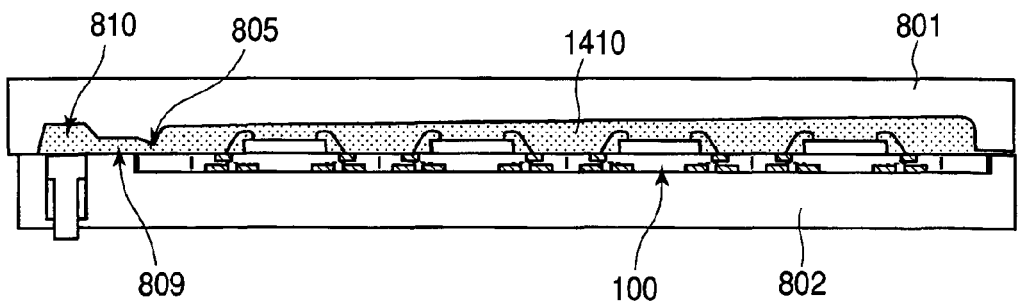
Figure 14D:
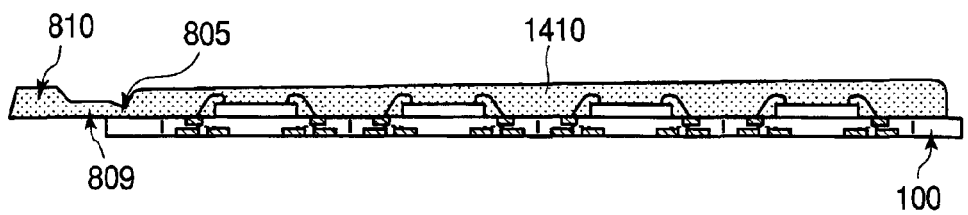

FIG. 12 is a plan view showing a schematic configuration of an intermediate structure formed by a sealing process according to a fourth exemplary embodiment of this invention.

The processes up to the wire bonding process are the same as those in the first exemplary embodiment, and hence description thereof will be omitted.

A sealing process for semiconductor devices according to the fourth exemplary embodiment of this invention will be described.

The sealing process for semiconductor devices according to the fourth exemplary embodiment is configured in the same manner as that of the first exemplary embodiment when viewed in cross section (see FIGS. 4A and 4B). Therefore, the same components are designated by the same reference numerals as in FIGS. 4A and 4B.

In the fourth exemplary embodiment, for injecting sealing resin into the cavity, a plurality of gates 1210, for example, five gates for each cavity are arranged at evenly spaced positions including positions close to the opposite ends of the cavity.

Molten sealing resin is injected into the cavity by a plunger through the plurality of gates arranged at evenly spaced positions including positions close to the opposite ends of the cavity. After filling the cavity with the sealing resin, the sealing resin is cured at a predetermined temperature, for example at 180° C., whereby the sealing resin is hardened and sealing bodies are formed.

The wiring board 100 is then taken out of the molding device (molding dies), and is subjected to reflow at a predetermined temperature, for example at 240° C. The sealing bodies are thereby completely hardened, and an intermediate structure 1200 for semiconductor devices as shown in FIG. 12 is formed, in which two sealing bodies 401a and 401b each having a region of a different resin thickness are formed in the two respective areas of the product formation portions 101 on the wiring board 100. The sealing resin on the gates 1210, runners 309 and culls 310 connected to the sealing bodies 401a and 401b of the intermediate structure 1200 is removed.

In the fourth exemplary embodiment, the intermediate structure 1200 is configured such that each of the sealing bodies 401a and 401b has a smaller resin thickness in the frame portion 106 on the wiring board 100 (see FIGS. 1A and 1B) than in the product formation portions 101 (see FIGS. 1A and 1B), and such that resin is injected through the gates 1210 arranged at evenly spaced positions including the positions close to the opposite ends of the cavity. This minimizes the cure shrinkage of the sealing bodies 401a and 401b, and makes it possible to reduce the uneven distribution of the filler, when viewed in plan, between the opposite ends of the cavity and a central portion of the cavity where the gates 1210 are provided. As a result, the warpage of the wiring board 100 can be reduced.

Then, like the first exemplary embodiment, the wiring board 100 having the sealing bodies 401a and 401b formed thereon is subjected to the ball mounting process and the board dicing process, whereby a semiconductor device 700 as shown in FIG. 7 is obtained.

Although my invention has been described based on a few exemplary embodiments, it should be understood that the invention is not limited to these embodiments and various changes and modifications are possible without departing from the spirit or scope of the appended claims.

For example, the description of the embodiments above has been made of the case in which the invention is applied to a semiconductor device in which one semiconductor chip is mounted on a wiring board. However, the invention is also applicable to a semiconductor device having a plurality of semiconductor chips mounted side-by-side or in layers.

Additionally, in the embodiments described above, the sealing bodies are formed such that the thickness of the sealing resin changes stepwise. However, as shown in FIGS. 13A to 13D or FIGS. 14A to 14D, the sealing bodies may be formed such that the thickness of the sealing resin changes continuously (gradually). According to this configuration in which no step is formed in the sealing resin, the cure shrinkage can be prevented in better balance.

More specifically, the alternative exemplary embodiment shown in FIGS. 13A to 13D is a modification of the first exemplary embodiment. In the first exemplary embodiment shown in FIGS. 3A to 3C, the cavity 303 is formed to decrease its depth stepwise from a central part toward the peripheral part. In the alternative exemplary embodiment shown in FIGS. 13A to 13D, a cavity 1300 is formed to decrease its depth continuously from a central part toward the peripheral part. More specifically, the cavity 1300 is formed such that the depth of the cavity 1300 is decreased continuously from the central part toward the side of the gate 305, and from the central part toward the side of the air vent 312. As a result, the sealing resin 1310 is formed such that the resin thickness is decreased continuously from its central part toward its peripheral part (see FIG. 13D). In other respects, the configuration is the same as that of the first exemplary embodiment shown in FIG. 3C, and hence description thereof will be omitted.

Another alternative exemplary embodiment shown in FIGS. 14A to 14D is a modification of the second exemplary embodiment. In the second exemplary embodiment shown in FIGS. 8A to 8C, the cavity 803 is formed such that its depth is increased stepwise from the side of the gate 805 toward the side of the air vent 812. In the alternative exemplary embodiment shown in FIGS. 14A to 14D, a cavity 1400 is formed such that its depth is increased continuously from the side of the gate 805 toward the side of the air vent 812. As a result, the sealing resin 1410 is formed such that the resin thickness is increased continuously from the side of the gate 805 toward the side of the air vent 812 (see FIG. 14D). In other respects, the configuration is the same as that of the second exemplary embodiment shown in FIGS. 8A to 8C, and therefore description thereof will be omitted.

Figure 15:
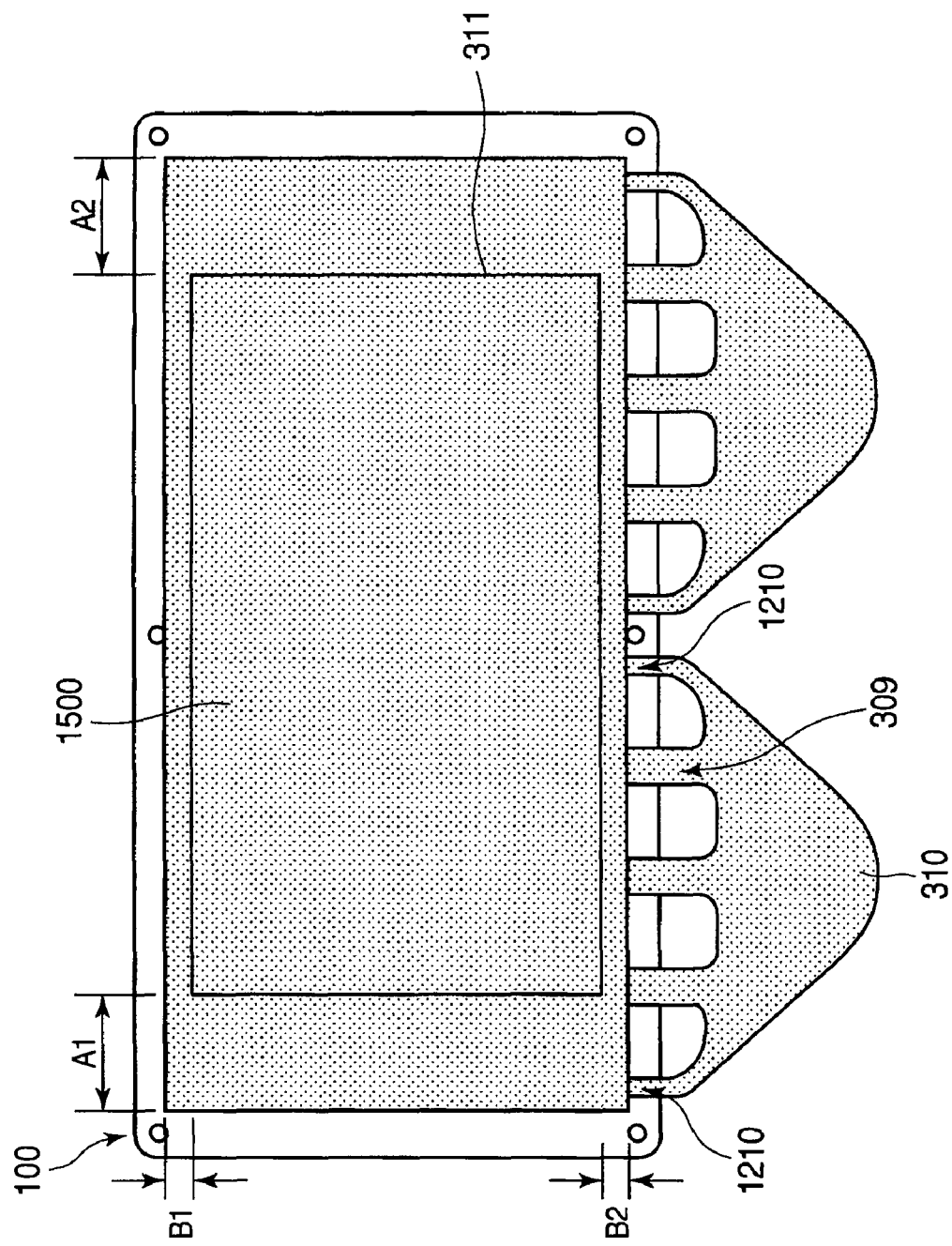
FIG. 15 is a plan view showing a rectangular sealing body according to an alternative embodiment of the fourth embodiment of this invention.

The description of the fourth exemplary embodiment above has been made in terms of the case in which, as shown in FIG. 12, the intermediate structure 1200 is formed with two separate sealing bodies 401a and 401b having a substantially square shape. However, as shown in FIG. 15, a rectangular-shaped sealing body 1500 may be provided instead. In this case, the cure shrinkage of the sealing resin will be greater in regions along the short sides than in regions along the long sides of the rectangle. Therefore, the regions A1 and A2 along the short sides where the thickness of the sealing resin is small are formed greater than the regions B1 and B2 along the long sides where the thickness of the sealing resin is small, so that the cure shrinkage can be prevented more effectively. Alternatively, the resin thickness of the regions along the short sides may be made smaller than the resin thickness of the regions along the long sides. In other respects, the configuration is the same as that in the fourth exemplary embodiment shown in FIG. 12, and therefore description thereof will be omitted.

Further, although the description of the exemplary embodiments has been made on the assumption that the wiring board is made of a glass-epoxy substrate, the invention may also be applicable to a flexible wiring board made of a polyimide substrate or the like.

According to the exemplary embodiments of this invention, a sealing body for collectively sealing a plurality of semiconductor chips mounted on a wiring board is formed with a region having different thickness, which makes it possible to minimize the cure shrinkage of the sealing resin and to reduce the warpage of the semiconductor device.

What is claimed is:

1. A method of manufacturing an intermediate structure for semiconductor devices, comprising:
preparing a wiring board having a plurality of product formation portions;
mounting a plurality of semiconductor chips on the product formation portions, respectively; and
sealing the semiconductor chips collectively by using a molding device which has a cavity having various depths and injecting resin into the cavity so as to form a sealing body having a region with a different resin thicknesses, wherein:
the cavity is formed such that a depth of a gate-side region is smaller than a depth of an air-vent-side region; and
the sealing body is formed by injecting the resin into the cavity, such that a resin thickness of the gate-side region is smaller than a resin thickness on the air-vent-side region.

2. The method as claimed in claim 1, wherein the cavity is formed such that the depth of the gate-side region becomes stepwise or continuously smaller than the depth of the air-vent-side region; and
the sealing body is formed such that a resin thickness is increased stepwise or continuously from the gate-side region toward the air-vent-side region.

3. The method as claimed in claim 1, wherein a peripheral portion is formed on an outside of the product formation portions;
the cavity is formed such that a depth of the peripheral portion is smaller than a depth of the product formation portion; and
the sealing body is formed, by injecting the resin into the cavity, such that a resin thickness of the peripheral portion is smaller than a resin thickness of the product formation portion.

4. The method as claimed in claim 1, wherein the sealing body is formed in a substantially rectangular shape, such that a thickness of a peripheral portion along short sides of the rectangle shape is smaller than a thickness of a peripheral portion along long sides of the rectangle shape.

5. The method as claimed in claim 1, wherein the sealing body is formed in a substantially rectangular shape; and
a region with a smaller thickness in the peripheral portion along the short sides is formed wider than a region with a smaller thickness in the peripheral portion along the long sides.

6. The method as claimed in claim 1, wherein the sealing body is formed by injecting the resin through a plurality of gates arranged at evenly spaced positions including positions close to opposite ends of the cavity.

7. The method as claimed in claim 1, wherein the region with the different resin thickness is formed so as to reduce warpage of at least one of the wiring board and the semiconductor device.

8. The method as claimed in claim 1, wherein the cavity is formed such that a depth of a peripheral portion is smaller than a depth of a central portion; and
the sealing body is formed by injecting the resin into the cavity such that a resin thickness of the peripheral portion is smaller than a resin thickness of the central portion.

9. The method as claimed in claim 8, wherein the cavity is formed such that the depth of the peripheral portion becomes stepwise or continuously smaller than the depth of the central portion; and
the sealing body is formed such that the resin thickness of the peripheral portion becomes stepwise or continuously smaller than the resin thickness of the central portion.

10. A method comprising:
preparing a wiring board including a plurality of product formation areas;
mounting a plurality of semiconductor chips on the plurality of product formation areas of the wiring board, respectively; and
forming a sealing body on the wiring board to cover the semiconductor chips;
wherein:
a first part of the sealing body formed above a selected one of the product formation areas is different in thickness from a second part of the sealing body formed above another of the product formation areas, and
the position of the second part in relevant to the another of the product formation areas is the same as that of the first part in relevant to the selected one of the product formation areas, and
wherein forming the sealing body on the wiring board includes:
preparing an upper mold including a cavity, the cavity comprises various depths to form the first part of the sealing body that is different in thickness from the second part of the sealing body;
providing the upper mold on the wiring board so that the plurality of semiconductor chips are disposed in the cavity;
injecting a sealing resin into the cavity while providing the upper mold on the wiring board;
curing the sealing resin to form the sealing body; and
removing the upper mold from the wiring board.

11. The method as claimed in claim 10, wherein the first part of the sealing body is smaller in thickness than the second part of the sealing body.

12. The method as claimed in claim 11, wherein the first part of the sealing body is formed above the selected one of the product formation areas that is located near a peripheral portion of the wiring board, and the second part of the sealing body is formed above the another of the product formation areas that is located near a central portion of the wiring board.

13. The method as claimed in claim 11, wherein the first part of the sealing body is formed above the selected one of the product formation areas that is located near a gate-side of the wiring board, and the second part of the sealing body is formed above the another of product formation areas that is located near an air-vent-side of the wiring board.

14. The method as claimed in claim 11, wherein the sealing body is formed such that a thickness of the sealing body becomes stepwise or continuously smaller from the second part toward the first part.

15. The method as claimed in claim 10, wherein the first part of the sealing body with the different thickness is formed so as to reduce warpage of the at least one of the wiring board and the semiconductor device.

16. The method as claimed in claim 10, further comprising:
dicing the wiring board and the sealing body to separate the plurality of product formation areas each accompanying an associated one of the semiconductor chips.

* * * * *